(12) United States Patent
Nakamura et al.

(10) Patent No.: US 12,212,295 B2
(45) Date of Patent: Jan. 28, 2025

(54) NONLINEAR MICROWAVE FILTER

(71) Applicant: JAPAN SCIENCE AND TECHNOLOGY AGENCY, Saitama (JP)

(72) Inventors: Yasunobu Nakamura, Tokyo (JP); Shingo Kono, Tokyo (JP); Kazuki Koshino, Ichikawa (JP)

(73) Assignee: JAPAN SCIENCE AND TECHNOLOGY AGENCY, Saitama (JP)

( * ) Notice: Subject to any disclaimer, the term of this patent is extended or adjusted under 35 U.S.C. 154(b) by 924 days.

(21) Appl. No.: 17/295,577

(22) PCT Filed: Nov. 22, 2019

(86) PCT No.: PCT/JP2019/045772
§ 371 (c)(1),
(2) Date: May 20, 2021

(87) PCT Pub. No.: WO2020/105732
PCT Pub. Date: May 28, 2020

(65) Prior Publication Data
US 2022/0021372 A1    Jan. 20, 2022

(30) Foreign Application Priority Data
Nov. 22, 2018 (JP) .................. 2018-219739

(51) Int. Cl.
*H03H 11/04* (2006.01)
*G06N 10/00* (2022.01)
*H10N 60/12* (2023.01)

(52) U.S. Cl.
CPC ......... *H03H 11/0405* (2013.01); *G06N 10/00* (2019.01); *H10N 60/12* (2023.02)

(58) Field of Classification Search
CPC .................................................. H03H 11/0405
See application file for complete search history.

(56) References Cited

U.S. PATENT DOCUMENTS 7,613,765 B1    11/2009   Hilton et al.
10,424,711 B2 *  9/2019   Schoelkopf, III ..... G06N 10/00
(Continued)

FOREIGN PATENT DOCUMENTS

CN    104838590 A    8/2015
CN    107482289 A    12/2017
(Continued)

OTHER PUBLICATIONS

Machine translation of JP 2017-055417 (Year: 2017).*
(Continued)

*Primary Examiner* — Paul A Wartalowicz
(74) *Attorney, Agent, or Firm* — Locke Lord LLP; Tim Tingkang Xia, Esq.

(57) ABSTRACT

This nonlinear microwave filter is provided with quantum bits that are formed on a circuit board in which target quantum bits are formed which are quantum bits controlled in a superconducting quantum circuit, and that are coupled to a control waveguide to which the target quantum bits are coupled, wherein the distance to a waveguide end in the control waveguide is within a predetermined range from semi integer times the resonant wavelength, the quantum bits have a resonant frequency in which the difference from the resonant frequency of the target quantum bits is within a predetermined range, and the coupling to the control waveguide is stronger by a predetermined value than the coupling between the target quantum bits and the control waveguide.

5 Claims, 12 Drawing Sheets

(56) References Cited

U.S. PATENT DOCUMENTS

2015/0263736 A1 9/2015 Herr et al.
2016/0380636 A1 12/2016 Abdo
2018/0062838 A1* 3/2018 Godfrey ............... H04L 9/0855

FOREIGN PATENT DOCUMENTS

| DE | 10145011 A1 | 3/2003 |
|----|-------------|--------|
| JP | 2016509800 A | 3/2016 |
| JP | 2017055417 A | 3/2017 |
| JP | 2018100946 A | 6/2018 |
| WO | 2014163728 A2 | 10/2014 |

OTHER PUBLICATIONS

Japan Patent Office, "International Search Report for PCT Application No. PCT/JP2019/045772", Japan, Feb. 10, 2020.
Office Action issued by the China Patent Office for Chinese Application No. 201980076395.4, China, Sep. 14, 2021.

* cited by examiner

NONLINEAR MICROWAVE FILTER

CROSS-REFERENCE TO RELATED PATENT APPLICATION

This application claims priority to Japanese Patent Application No. 2018-219739, filed Nov. 22, 2018, the content of which is incorporated herein by reference.

FIELD OF THE INVENTION

The present invention relates to a nonlinear microwave filter.

BACKGROUND OF THE INVENTION

Research and development for a technology related to a quantum computer are being performed. In the technology related to the quantum computer, a method for performing a two-qubit gate operation in the quantum computer using a superconducting qubit is known (refer to Patent Documents 1 and 2).

CITATION LIST

Patent Documents

Patent Document 1: U.S. Pat. No. 7,613,765.
Patent Document 2: U.S. Patent Application Publication No. 2016/0380636.

SUMMARY OF THE INVENTION

Technical Problem

In order to control a superconducting qubit (hereinafter, simply referred to as a qubit), the qubit is coupled to a waveguide and a microwave pulse is irradiated from the waveguide. However, the coupling to the waveguide causes radiation relaxation of the qubit and shortens the lifetime of the qubit.

In the related art, a coupling between the qubit and the waveguide has been reduced in order to suppress radiation relaxation. However, a method for reduced coupling also reduces an interaction between a control pulse and the qubit, so that there is a drawback in that the time required for a gate operation (gate time) becomes long. Another method is to interpose a frequency filter, but the control pulse is also weakened by the frequency filter in the method to interpose a frequency filter, so that the gate time also becomes long. It is conceivable to increase a control pulse intensity to increase a gate velocity. However, when the control pulse intensity is increased and the number of qubits increases, a thermal load on a refrigerator increases.

An object of the present invention is to provide a nonlinear microwave filter in which it is possible to suppress a long operation time of the qubit and to suppress a short lifetime of the qubit at the same time.

Solution to Problem

In order to achieve the aforementioned objects, according to an aspect of the present invention, a nonlinear microwave filter is provided, including: a qubit that is formed on a circuit substrate on which a target qubit, which is a qubit to be controlled in a superconducting quantum circuit, is formed, and that is coupled to a control waveguide to which the target qubit is coupled, in which a distance to a waveguide end of the control waveguide is within a predetermined range from a half-integer multiple of a resonance wavelength, the qubit has a resonant frequency the deviation of which from a resonant frequency of the target qubit is within a predetermined range, and a coupling between the qubit and the control waveguide is stronger by a predetermined value than a coupling between the target qubit and the control waveguide.

Further, according to the aspect of the present invention, in the nonlinear microwave filter, the target qubit is positioned at the waveguide end.

Further, according to the aspect of the present invention, the nonlinear microwave filter is the qubit formed on a back surface of a substrate surface on which the target qubit is formed in substrate surfaces of the circuit substrate.

Advantageous Effects of the Invention

According to the present invention, it is possible to suppress a long operation time of the qubit and to suppress a short lifetime of the qubit at the same time.

DESCRIPTION OF EMBODIMENTS OF THE INVENTION

Embodiment

Hereinafter, an embodiment of the present invention will be described in detail with reference to the accompanying drawings.

Control of Qubit

Before explaining a method for controlling a target qubit Q1 of the present embodiment, a method for controlling a target qubit according to the related art will be described with reference to FIG. 15.

Figure 15:
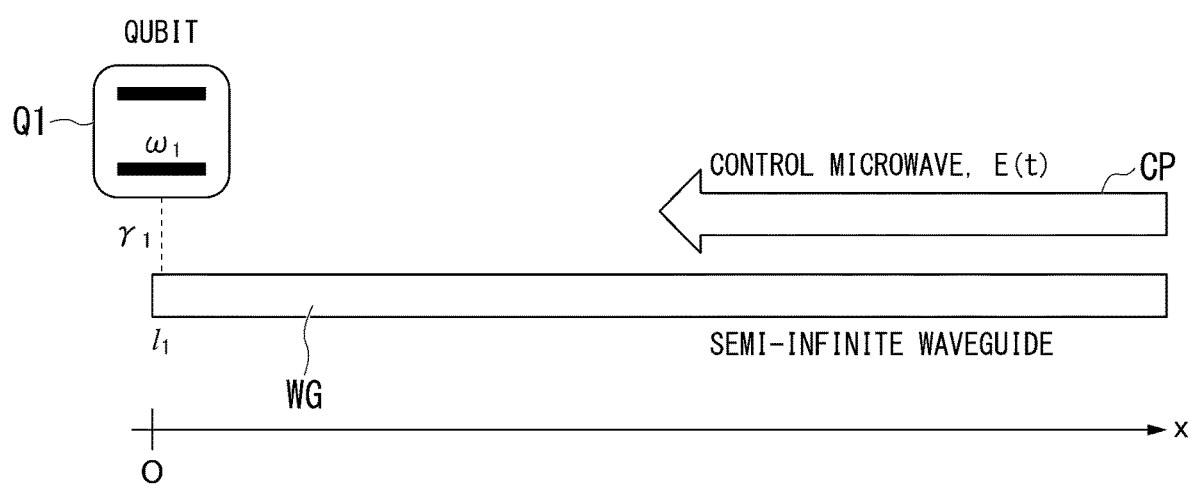
FIG. 15 is a diagram showing an example of a method for controlling a target qubit according to the related art.

FIG. 15 is a diagram showing an example of the method for controlling a target qubit according to the related art. A semi-infinite waveguide WG is provided on a circuit substrate. A target qubit Q1 is controlled by a control microwave CP propagating through the semi-infinite waveguide WG. Here, a coupling between the target qubit Q1 and the semi-infinite waveguide WG is referred to as a coupling $\gamma_1$.

The coupling $\gamma_1$ has two meanings. First, the coupling $\gamma_1$ represents a magnitude of a decay rate of the target qubit Q1. Second, the coupling $\gamma_1$ represents a magnitude of a coupling between the target qubit Q1 and the control microwave CP. The equation of motion for quantum coherence of the target qubit Q1 is represented by Equation (1).

$$\frac{d}{dt}\langle\sigma_1\rangle = -\gamma_1\langle\sigma_1\rangle - i\left(1 - 2\langle\sigma_1^\dagger\sigma_1\rangle\right)\sqrt{2\gamma_1}\,E(t) \tag{1}$$

The first term on a right side of Equation (1) is a term representing decay of the target qubit Q1. The second term on the right side of Equation (1) is a term representing the coupling between the target qubit Q1 and the control microwave CP.

Here, a relationship among the coupling $\gamma_1$ of the target qubit Q1, a qubit lifetime T1, and a gate time Tg will be described. The gate time Tg is the length of time required to operate the target qubit Q1.

As represented in Equation (2), the qubit lifetime T1 is inversely proportional to the coupling $\gamma_1$. That is, the qubit lifetime T1 becomes shorter as the coupling $\gamma_1$ between the target qubit Q1 and the semi-infinite waveguide WG becomes stronger.

$$T_1 \sim \frac{1}{\gamma_1} \tag{2}$$

On the other hand, as represented in Equation (3), the gate time Tg is inversely proportional to a square root of the coupling $\gamma_1$.

$$T_g \sim \frac{1}{\sqrt{8\gamma_1}\,E} \tag{3}$$

Here, an amplitude E is an electric field amplitude of the control microwave CP. According to Equation (3), the gate time Tg becomes shorter as the coupling $\gamma_1$ between the target qubit Q1 and the semi-infinite waveguide WG becomes stronger.

According to Equations (2) and (3), the gate time Tg becomes long when the qubit lifetime T1 is lengthened. On the other hand, the qubit lifetime T1 is shortened when the gate time Tg is shortened. That is, extension of the qubit lifetime T1 and reduction of the gate time Tg are in a trade-off relationship.

Next, a method for controlling the target qubit Q1 of the present embodiment will be described with reference to FIG. 1.

Figure 1:
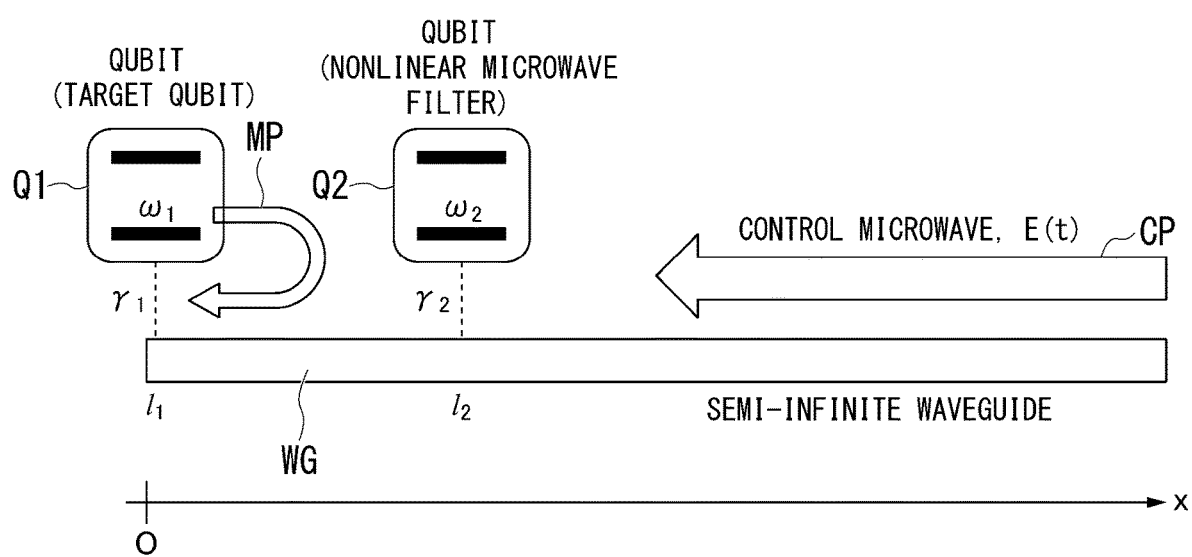
FIG. 1 is a diagram showing an example of a method for controlling a target qubit according to an embodiment of the present invention.

FIG. 1 is a diagram showing an example of the method for controlling the target qubit Q1 according to the present embodiment. Both the target qubit Q1 and a nonlinear microwave filter Q2 are coupled to the semi-infinite waveguide WG. The nonlinear microwave filter Q2 includes a qubit.

As represented in Equation (4), a resonant frequency $\omega_1$ of the target qubit Q1 and a resonant frequency $\omega_2$ of the nonlinear microwave filter Q2 are equal to each other. Hereinafter, both the resonant frequency $\omega_1$ and the resonant frequency $\omega_2$ are referred to as a resonant frequency $\omega_0$. Further, a wavelength of a microwave corresponding to the resonant frequency $\omega_0$ is represented by a microwave wavelength $\lambda_0$. The microwave wavelength $\lambda_0$ is given as $2\pi v/\omega_0$. Let the velocity v be a microwave propagation velocity in the waveguide, that is approximately 0.4 times the light velocity.

$$\omega_1 = \omega_2 (= \omega_0) \tag{4}$$

A difference between the resonant frequency of the target qubit Q1 and the resonant frequency of the nonlinear microwave filter Q2 may be within a predetermined range. Therefore, the nonlinear microwave filter Q2 has a resonant frequency in which a difference from the resonant frequency of the target qubit Q1 is within the predetermined range.

Further, as represented in Equation (5), a coupling $\gamma_2$ between the nonlinear microwave filter Q2 and the semi-infinite waveguide WG is much larger than the coupling $\gamma_1$ between the target qubit Q1 and the semi-infinite waveguide WG.

$$\gamma_1 \ll \gamma_2 \tag{5}$$

Here, a fact that the coupling $\gamma_2$ is much larger than the coupling $\gamma_1$ indicates that, for example, the coupling $\gamma_2$ is approximately 100 to 1,000 times as large as the coupling $\gamma_1$. That is, the nonlinear microwave filter Q2 has the coupling $\gamma_2$ with the semi-infinite waveguide WG, which is larger than the coupling between the target qubit Q1 and the semi-infinite waveguide WG by a predetermined value.

Here, a lower limit of the coupling $\gamma_2$ is, for example, approximately 5000 times the coupling $\gamma_1$. An upper limit of the coupling $\gamma_2$ is, for example, a value of approximately 10% of the resonant frequency. When the coupling $\gamma_2$ has a value of approximately 10% of the resonant frequency, a ratio of the coupling $\gamma_2$ to the coupling $\gamma_1$ is 25,000 times.

Further, as represented in Equation (6), a distance between the nonlinear microwave filter Q2 and a waveguide end point is a value which is not equal to ($\frac{1}{4}$+n/2) times the microwave wavelength $\lambda_0$ corresponding to the resonant frequency $\omega_0$.

$$l_2 \neq \left(\frac{1}{4} + \frac{n}{2}\right)\lambda_0 \qquad (6)$$

A distance $l_2$ indicates a distance of the nonlinear microwave filter Q2 from an origin of coordinates on the semi-infinite waveguide WG. Here, a positive direction of an x-axis, which is a coordinate axis on the semi-infinite waveguide WG, is opposite to a direction in which the control microwave CP is incident on the semi-infinite waveguide WG. A position of an origin of the x-axis is set to a position of an end point of the semi-infinite waveguide WG, so that the boundary condition of electric field is set to be open.

A distance $l_1$ indicates a distance of the target qubit Q1 from the origin of the x-axis. Since the target qubit Q1 is disposed at the end point, a value of the distance $l_1$ is 0.

Since one microwave photon MP emitted from the target qubit Q1 is reflected by the nonlinear microwave filter Q2, the nonlinear microwave filter Q2 functions as a perfect reflector and forms a resonator together with the waveguide end point. Under a condition of the above-described Equation (6), the decay of the target qubit Q1 is suppressed. When the nonlinear microwave filter Q2 is provided, the lifetime of the target qubit Q1 becomes significantly long, compared to a case where the nonlinear microwave filter Q2 is not provided.

In addition, since the nonlinear microwave filter Q2 acts as an artificial two-level atom, the nonlinear microwave filter Q2 can interact with only one microwave photon MP and is quickly saturated by the high-intensity control microwave CP, so that the nonlinear microwave filter Q2 almost completely transmits the control microwave CP. Since the nonlinear microwave filter Q2 almost completely transmits the control microwave CP, the control of the target qubit Q1 by the control microwave CP is hardly affected by the nonlinear microwave filter Q2. That is, even when the nonlinear microwave filter Q2 is provided, the target qubit Q1 can be controlled at high speed by the high-intensity control microwave CP.

In the method for controlling the target qubit Q1 according to the related art, it has been described that the extension of the qubit lifetime T1 and the reduction of the gate time Tg are in a trade-off relationship. However, in the method for controlling the target qubit Q1 of the present embodiment, the trade-off relationship is eliminated.

Since the decay of the target qubit Q1 is completely suppressed by the nonlinear microwave filter Q2, the qubit lifetime T1 does not depend on the strength of the coupling $\gamma_1$. On the other hand, even when the nonlinear microwave filter Q2 is provided, the relationship between the gate time Tg and the coupling $\gamma_1$ satisfies the above-described Equation (3). That is, the gate time Tg can be shortened by increasing the coupling $\gamma_1$, and the trade-off relationship between the extension of the qubit lifetime T1 and the reduction of the gate time Tg is eliminated.

Parameter values in the method for controlling the target qubit Q1 of the embodiment are as follows.

The value of the resonant frequency $\omega_1$ is set so that Equation (7) is satisfied.

$$\omega_1/2\pi = 10 \text{ GHz} \qquad (7)$$

A value of the resonant frequency $\omega_2$ is set so that Equation (8) is established.

$$\omega_2/2\pi = 10 \text{ GHz} \qquad (8)$$

In the embodiment, the value of the resonant frequency $\omega_2$ is equal to the value of the resonant frequency $\omega_1$.

The coupling $\gamma_1$ is set so that Equation (9) is established.

$$\gamma_1/2\pi = 50 \text{ kHz}$$

The coupling $\gamma_2$ is set so that Equation (10) is established.

$$\gamma_2/2\pi = 50 \text{ MHz} \qquad (10)$$

The distance $l_1$ is set so that Equation (11) is established.

$$l_1 = 0 \qquad (11)$$

The distance $l_2$ is set so that Equation (12) is established.

$$l_2 = \frac{\lambda_0}{2} \qquad (12)$$

Lifetime of Target Qubit

The lifetime of the target qubit Q1 will be described in detail.

The states of the target qubit Q1, the nonlinear microwave filter Q2, and the microwave photon MP shown in FIG. 1 are represented by Equations (13) and (14) using a state vector.

$$|\psi(0)\rangle = \sigma_1^\dagger |vac\rangle \qquad (13)$$

$$|\psi(t)\rangle = \alpha(t)\sigma_1^\dagger |vac\rangle + \beta(t)\sigma_2^\dagger |vac\rangle + \int dr g(r,t) b_r^\dagger |vac\rangle \qquad (14)$$

$\sigma_1^\dagger$ on a right side of Equation (13) is an operator that represents an operation of creating an excitation in the qubit, and |vac> indicates a state with no excitation in the system. That is, Equation (13) represents that the target qubit Q1 is in an excited state in an initial state, and there is no microwave photon MP in the waveguide. The first term on a right side of Equation (14) represents a state in which the target qubit Q1 is excited, the second term represents a state in which the nonlinear microwave filter Q2 is excited, and the third term represents a state in which the microwave photon MP is emitted into the waveguide.

Time evolution of a coefficient $\alpha(t)$ is represented by Equation (15), and time evolution of a coefficient $\beta(t)$ is represented by Equation (16).

$$\frac{d}{dt}\alpha(t) = \left(-i\omega_1 - \frac{\gamma_1}{2}\right)\alpha(t) - \qquad (15)$$
$$\frac{\gamma_1}{2}\alpha(t - 2l_1) - \frac{\sqrt{\gamma_1\gamma_2}}{2}[\beta(t - l_1 - l_2) + \beta(t + l_1 - l_2)]$$

$$\frac{d}{dt}\beta(t) = \left(-i\omega_2 - \frac{\gamma_2}{2}\right)\beta(t) - \qquad (16)$$
$$\frac{\gamma_2}{2}\beta(t - 2l_2) - \frac{\sqrt{\gamma_1\gamma_2}}{2}[\alpha(t - l_1 - l_2) + \alpha(t + l_1 - l_2)]$$

By approximately solving equations (15) and (16) under the conditions of equations (17) to (19), Equations (20) and (21) are obtained.

$$\omega_1 = \omega_2 (= \omega_0) \qquad (17)$$

$$l_1 = 0 \qquad (18)$$

-continued $$l_2 = \left(\frac{n}{2}\right)\lambda_0 \tag{19}$$

$$\alpha(t) = \frac{\gamma_2}{\gamma_1 + \gamma_2} + \frac{\gamma_1}{\gamma_1 + \gamma_2} e^{-(\gamma_1+\gamma_2)t} \tag{20}$$

$$\beta(t) = (-)^{n+1} \frac{\sqrt{\gamma_1\gamma_2}}{\gamma_1 + \gamma_2}\left[1 - e^{-(\gamma_1+\gamma_2)t}\right] \tag{21}$$

When a condition that the coupling $\gamma_2$ is much larger than the coupling $\gamma_1$ (the condition represented by Equation (5)) is satisfied, fidelity indicating that the target qubit Q1 is in the excited state is represented by Equation (22).

$$\text{Fidelity} = |\alpha|^2 = \left(\frac{\gamma_2}{\gamma_1+\gamma_2}\right)^2 \simeq 1 - \frac{2\gamma_1}{\gamma_2} \tag{22}$$

According to Equation (22), when the coupling $\gamma_2$ is 1,000 times the coupling $\gamma_1$, the fidelity indicating that the target qubit Q1 is in the excited state is 0.998. That is, the decay of the target qubit Q1 is almost suppressed under the condition that the coupling $\gamma_2$ is much larger than the coupling $\gamma_1$.

Figure 2:
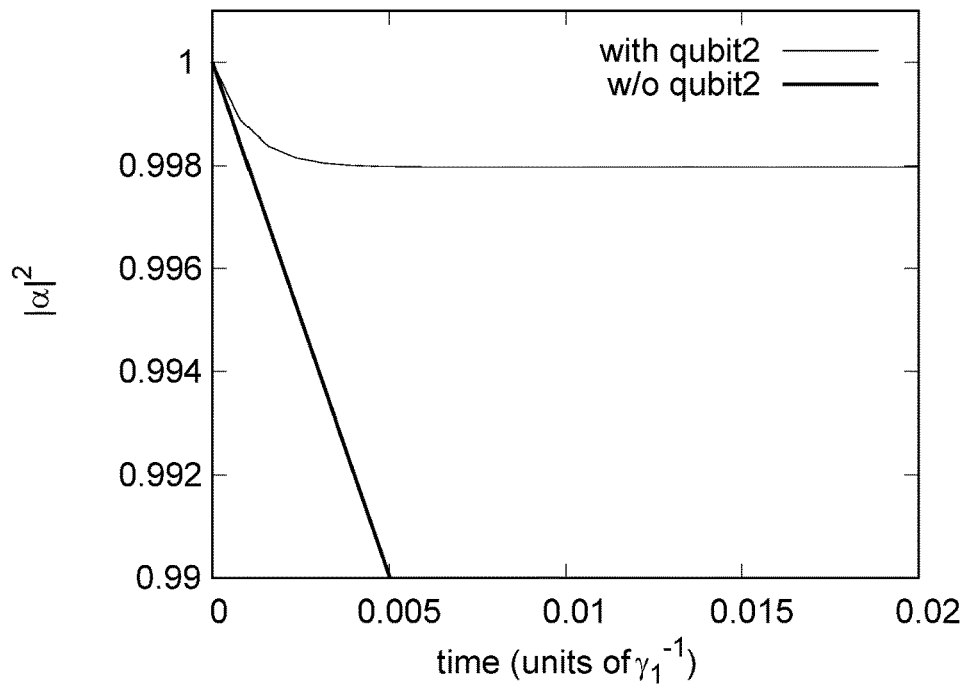
FIG. 2 is a diagram showing an example of a relationship between the presence/absence of a nonlinear microwave filter and decay of a target qubit according to the embodiment of the present invention.

FIG. 2 is a diagram showing an example of a relationship between the presence/absence of the nonlinear microwave filter 2 and the decay of the target qubit Q1 according to the present embodiment. FIG. 2 shows a time dependence of a probability $|\alpha|^2$ that the target qubit Q1 is in the excited state when the value of the resonant frequency $\omega_1$ is $2\pi\times10$ GHz under the condition in which the resonant frequency $\omega_2$ and the resonant frequency $\omega_1$ are equal.

Even when the nonlinear microwave filter Q2 is not exactly placed at a position corresponding to a half-integer multiple of the resonance wavelength, the decay of the target qubit Q1 is suppressed. When the nonlinear microwave filter Q2 is placed at a position represented by Equation (23), the decay of the target qubit Q1 is not suppressed.

$$l_2 = \left(\frac{1}{4} + \frac{n}{2}\right)\lambda_0 \tag{23}$$

In general, when there is a coupling between an atom and an electromagnetic field, a shift occurs in the resonant frequency. Therefore, strictly speaking, when the target qubit Q1 is coupled to the waveguide, the resonant frequency $\omega_1$ also causes a frequency shift. Although the frequency shift is represented by Equation (24) when the resonant frequency $\omega_0$ before the shift is used, the shift amount is overwhelmingly small compared to an effective frequency range (approximately $\omega_2-\gamma_2$ to $\omega_2+\gamma_2$) of the nonlinear microwave filter 2. Therefore, this phenomenon does not affect an operation of the nonlinear microwave filter 2.

$$\omega_0 \to \omega_0 + \gamma_1 \tan\left(\frac{2\pi l_2}{\lambda_0}\right) \tag{24}$$

When the resonant frequency $\omega_1$ and the resonant frequency $\omega_2$ are equal, it can be interpreted that the target qubit Q1 interacts with the resonator formed by the end point of the waveguide and the nonlinear microwave filter Q2. In this resonator, a position of x=0 is the open end, and a position of $x=l_2$ is a fixed end. The resonant frequency of the resonator is represented by Equation (25).

$$\omega_n = \frac{\pi v}{l_2}\left(\frac{1}{2} + n\right) \tag{25}$$

The resonant frequency of the resonator formed by the nonlinear microwave filter Q2 is represented by Equation (25). Therefore, when the distance $l_2$ of the nonlinear microwave filter Q2 satisfies the above-described Equation (6), the target qubit Q1 interacts non-resonantly with the resonator, so that decay is not possible.

Control of Qubit

Control of the target qubit Q1 will be described in detail.

The equation of motion of a quantum coherence of the target qubit Q1 and the equation of motion of a quantum coherence of the nonlinear microwave filter Q2 are represented as Equations (26) and (27).

$$\frac{d}{dt}\langle\sigma_1\rangle = (-i\omega_1 - \gamma_1)\langle\sigma_1\rangle - \tag{26}$$
$$\sqrt{\gamma_1\gamma_2}\left(1 - 2\langle\sigma_1^\dagger\sigma_1\rangle\right)\langle\sigma_2\rangle - i\left(1 - 2\langle\sigma_1^\dagger\sigma_1\rangle\right)\sqrt{2\gamma_1}\,E_{in}(t)$$

$$\frac{d}{dt}\langle\sigma_2\rangle = (-i\omega_2 - \gamma_2)\langle\sigma_2\rangle - \tag{27}$$
$$\sqrt{\gamma_1\gamma_2}\left(1 - 2\langle\sigma_2^\dagger\sigma_2\rangle\right)\langle\sigma_1\rangle - i\left(1 - 2\langle\sigma_2^\dagger\sigma_2\rangle\right)\sqrt{2\gamma_2}\,E_{in}(t)$$

In Equation (26), which is the equation of motion of the quantum coherence of the target qubit Q1, the second term represents an interaction with the nonlinear microwave filter Q2, and the third term represents an interaction with the control microwave CP. In Equation (27), which is the equation of motion of the quantum coherence of the nonlinear microwave filter Q2, the second term represents an interaction with the target qubit Q1 and the third term represents the interaction with the control microwave CP.

When the target qubit Q1 is controlled by the control microwave CP and Equation (28) is satisfied, the effect of the nonlinear microwave filter Q2 can be ignored. Here, $|E_{in}|^2$ represents the number of photons per unit time, which are possessed by the control microwave CP.

$$\gamma_2 << |E_{in}|^2 \tag{28}$$

Figure 3:
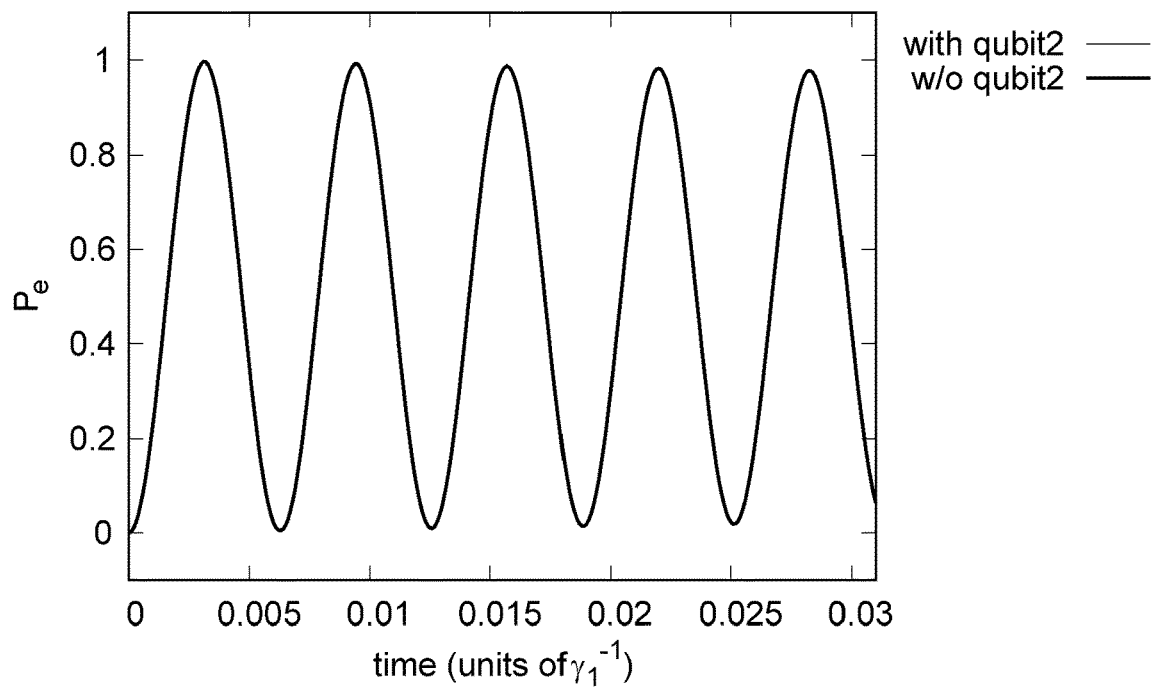
FIG. 3 is a diagram showing an example of the relationship between the presence/absence of the nonlinear microwave filter and Rabi oscillation of the target qubit according to the embodiment of the present invention.

FIG. 3 is a diagram showing an example of a relationship between the presence/absence of the nonlinear microwave filter Q2 and Rabi oscillation of the target qubit Q1 according to the present embodiment. FIG. 3 shows a response of the target qubit Q1 when the nonlinear microwave filter Q2 is positioned at a position corresponding to a half the resonance wavelength, the coupling $\gamma_2$ is 100 times the coupling $\gamma_1$, and a Rabi frequency $\Omega1$ is set to 1,000 times the coupling $\gamma_1$.

In the example shown in FIG. 3, the response of the target qubit Q1 when the nonlinear microwave filter Q2 is provided and the response of the target qubit Q1 when the nonlinear microwave filter Q2 is not provided substantially overlap.

As the amplitude of the control microwave CP, that is, the Rabi frequency $\Omega1$ increases, a difference becomes small between the response of the target qubit Q1 in the case where the nonlinear microwave filter Q2 is provided and the response of the target qubit Q1 in the case where the nonlinear microwave filter Q2 is not provided. That is, the larger the amplitude of the control microwave CP, the smaller the difference. Therefore, as described above, it is confirmed that the effect of the nonlinear microwave filter Q2 can be ignored when Equation (28) is satisfied.

In the present embodiment, a description is provided of the case where a boundary condition at the end point of the semi-infinite waveguide WG is the open end with respect to the electric field. However, the present invention is not limited thereto. The boundary condition at the end point of the semi-infinite waveguide WG may be a fixed end with respect to the electric field. Even when the boundary condition at the end point of the semi-infinite waveguide WG is the fixed end with respect to the electric field, it can be interpreted that the end point of the waveguide and the nonlinear microwave filter 2 form the resonator. In the resonator, the position of x=0 is the fixed end, and the position of x=$l_2$ is the fixed end. The resonant frequency of the resonator is represented by Equation (29).

$$\omega_n = \frac{\pi v n}{l_2} \quad (29)$$

The resonant frequency $\omega_n$ of the resonator formed by the nonlinear microwave filter 2 is represented by Equation (29). Therefore, when the distance l2 of the nonlinear microwave filter 2 satisfies Equation (30), the target qubit 1 interacts non-resonantly with the resonator, so that decay is not possible.

$$l_2 \neq \left(\frac{n}{2}\right)\lambda_0 \quad (30)$$

In the present embodiment, the case where the target qubit Q1 is placed at the position where x=0 in the semi-infinite waveguide WG, that is, the case where the target qubit Q1 is positioned at the end of the waveguide is described. However, the present invention is not limited thereto. The target qubit Q1 may be provided in an infinite waveguide.

When the target qubit Q1 and the nonlinear microwave filter Q2 are provided in the infinite waveguide, the nonlinear microwave filter Q2 creates a fixed-end boundary condition for the electric field. Therefore, when the distance between the target qubit Q1 and the nonlinear microwave filter Q2 is the half-integer multiple of the resonance wavelength, vacuum fluctuation of the electric field at the position of the target qubit Q1 is eliminated, so that the decay of the target qubit Q1 is suppressed.

However, in order to suppress the decay of the target qubit Q1, it is necessary to set the distance between the nonlinear microwave filter Q2 and the target qubit Q1 to be equal to the half-integer multiple of the resonance wavelength with high accuracy compared to a case of the semi-infinite waveguide WG.

Further, when the target qubit Q1 is provided in the infinite waveguide, in order to control the decay of the target qubit Q1, it is necessary to cause the resonant frequency $\omega_1$ and the resonant frequency $\omega_2$ to be equal with high accuracy, compared to the case of the semi-infinite waveguide WG.

Here, an equivalent circuit of the target qubit Q1 and an equivalent circuit of the nonlinear microwave filter Q2 will be described with reference to FIG. 4.

Figure 4:
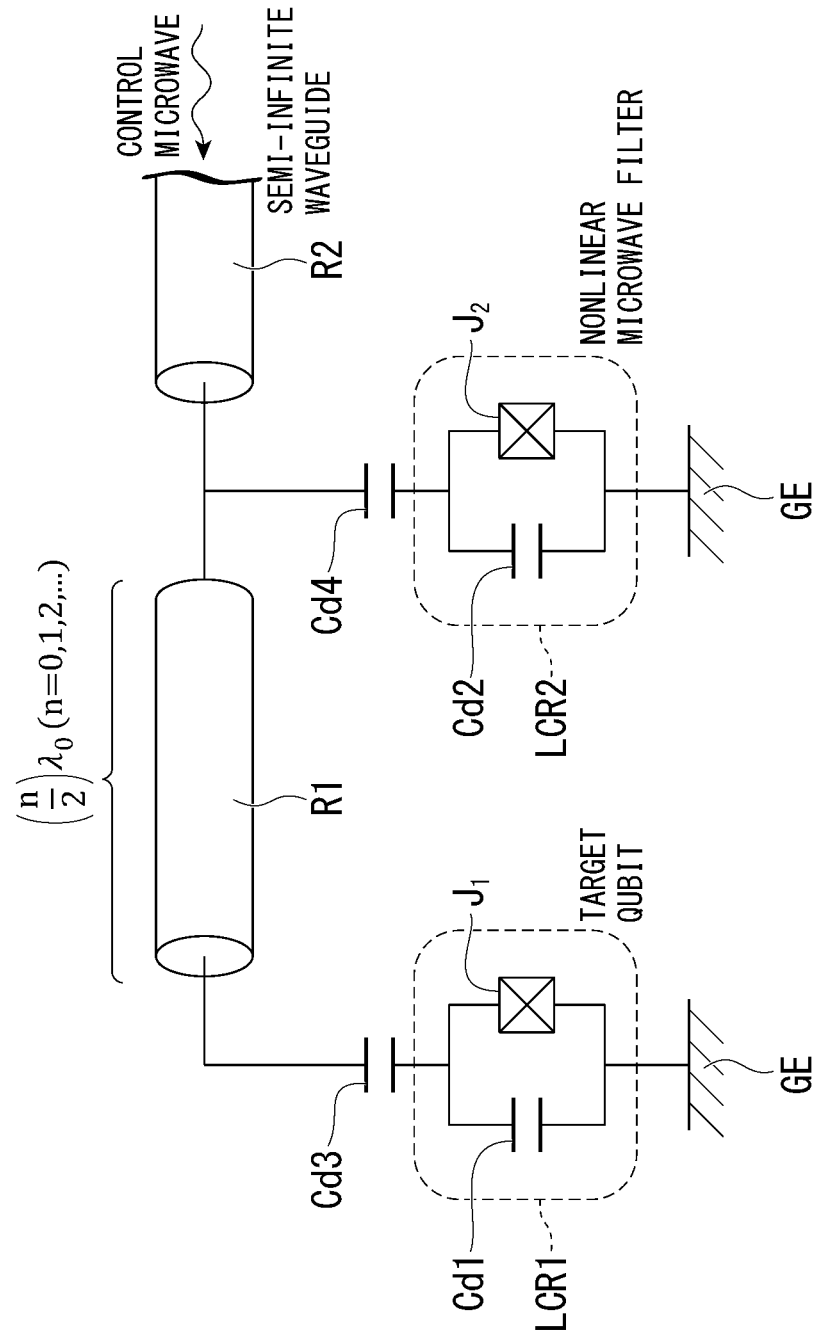
FIG. 4 is a diagram showing an example of equivalent circuits of the target qubit and the nonlinear microwave filter when the target qubit according to the embodiment of the present invention is placed at an end of a semi-infinite waveguide.

FIG. 4 shows an example of the equivalent circuits of the target qubit Q1 and the nonlinear microwave filter Q2 when the target qubit Q1 according to the present embodiment is placed at the end of the semi-infinite waveguide WG (when the end point of the waveguide is the open end with respect to the electric field)

A nonlinear LC resonator LCR1 is formed by a capacitor Cd1 and an inductor derived from a Josephson junction $J_1$. The nonlinear LC resonator LCR1 corresponds to the target qubit Q1. A nonlinear LC resonator LCR2 is formed by a capacitor Cd2 and an inductor derived from a Josephson junction $J_2$. The nonlinear LC resonator LCR2 corresponds to the nonlinear microwave filter Q2.

The Josephson junction $J_1$ and the Josephson junction $J_2$ may each be replaced with a superconducting quantum interference device (SQUID) for adjustment of the resonant frequency.

A lead wire R1 and a lead wire R2 correspond to the semi-infinite waveguide WG through which the control microwave CP propagates. A capacitor Cd4 corresponds to an electrical capacitance formed between the nonlinear microwave filter Q2 and the semi-infinite waveguide WG. A capacitor Cd3 corresponds to an electrical capacitance formed between the target qubit Q1 and the semi-infinite waveguide WG. A length of the lead wire R1 corresponds to the distance $l_2$ between the end point of the semi-infinite waveguide WG and the nonlinear microwave filter Q2, and is a half-integer multiple of the microwave wavelength $\lambda_0$ corresponding to the resonant frequency $\omega_0$ as represented in Equation (19), which is an optimum condition.

A ground GE corresponds to a ground electrode of the superconducting quantum circuit QC on which the target qubit Q1 is formed.

Next, with reference to FIG. 5, an equivalent circuit when the target qubit Q1 is not placed at the end of the waveguide (when the end point of the waveguide is the fixed end with respect to the electric field) will be described.

Figure 5:
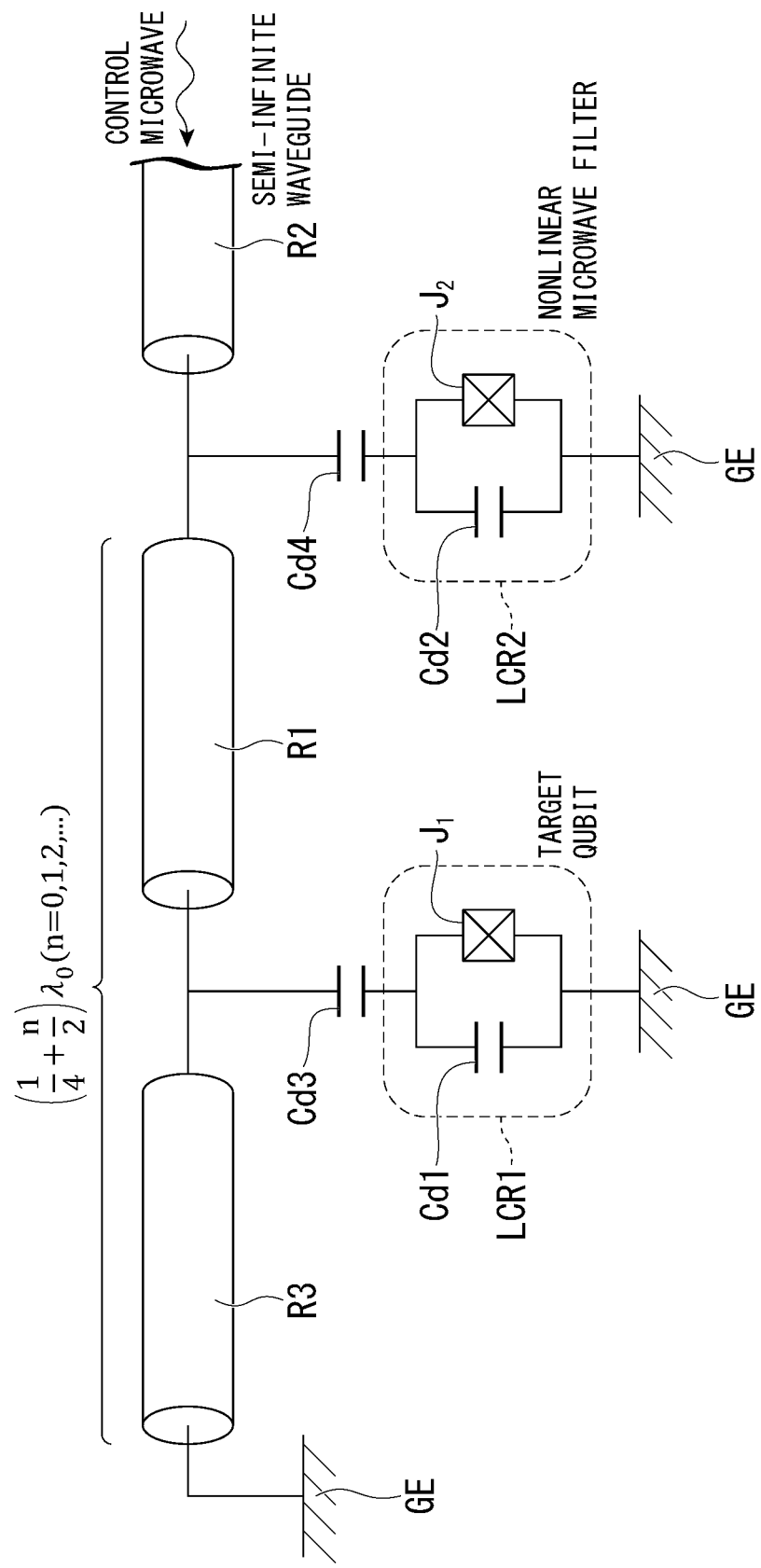
FIG. 5 is a diagram showing an example of equivalent circuits of the target qubit and the nonlinear microwave filter when the target qubit according to the embodiment of the present invention is not placed at the end of the semi-infinite waveguide.

FIG. 5 is a diagram showing another example of the equivalent circuits of the target qubit Q1 and the nonlinear microwave filter Q2 when the target qubit Q1 according to the present embodiment is not placed at the end of the semi-infinite waveguide WG.

A lead wire R3 corresponds to the semi-infinite waveguide WG. The nonlinear LC resonator LCR1 and the lead wire R3 are connected in parallel with respect to the lead wire R1 in response to the fact that the target qubit Q1 is not placed at the end of the waveguide. An end of the lead wire R3 is connected to the ground GE.

The nonlinear microwave filter Q2 functions as the fixed end and forms the resonator, together with the fixed end of the waveguide end point. Based on a condition that the resonant frequency of the resonator does not match the resonant frequency of the target qubit Q1, a sum of the length of the lead wire R1 and the length of the lead wire R3 needs to satisfy Equation (30). An optimum value is represented by Equation (31).

$$l_2 = \left(\frac{1}{4} + \frac{n}{2}\right)\lambda_0 \quad (31)$$

Figure 6:
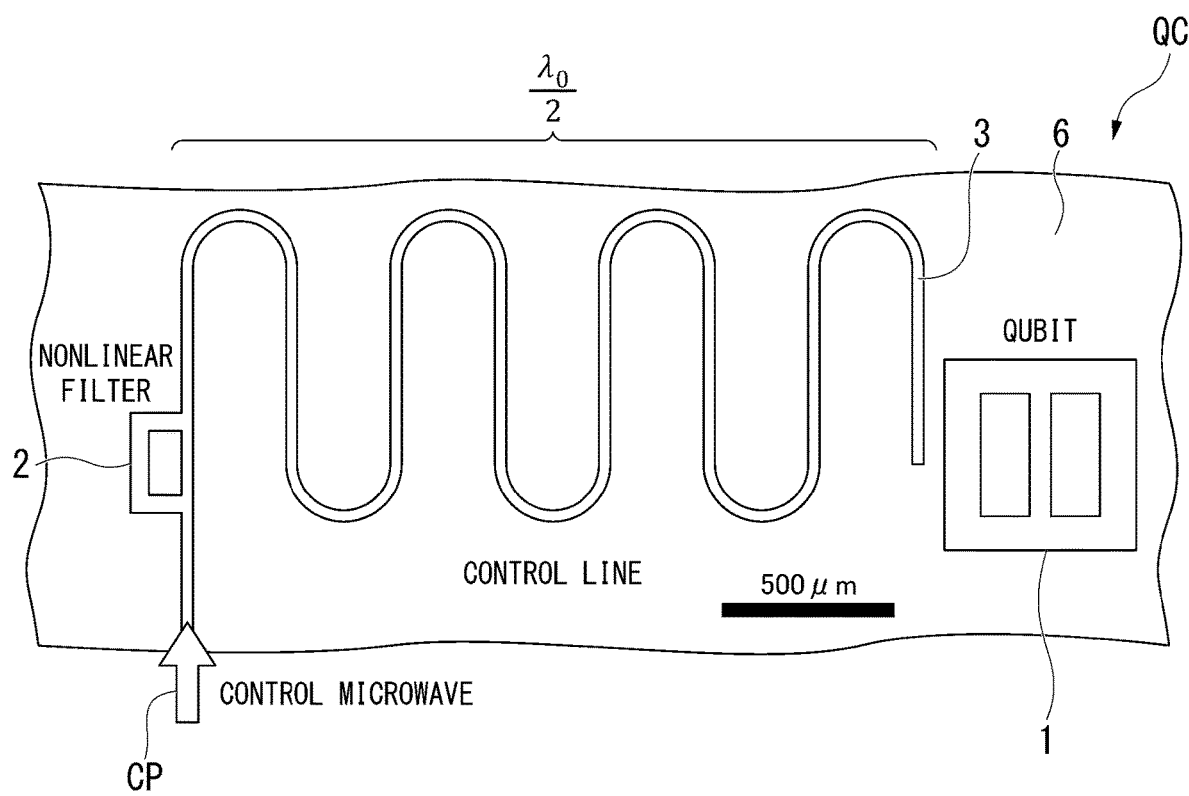
FIG. 6 is a diagram showing an example of a superconducting quantum circuit according to the embodiment of the present invention.

FIG. 6 is a diagram showing an example of the superconducting quantum circuit QC according to the present embodiment. The superconducting quantum circuit QC includes a target qubit 1, a nonlinear microwave filter 2, a control line 3, and a circuit substrate 6. The target qubit 1 corresponds to the target qubit Q1 of FIG. 1. The nonlinear microwave filter 2 corresponds to the nonlinear microwave filter Q2 of FIG. 1. The control line 3 corresponds to the semi-infinite waveguide WG of FIG. 1.

The circuit substrate 6 is, for example, a dielectric substrate such as silicon. In the circuit substrate 6, a wiring pattern and a ground pattern of circuit elements are formed by a superconducting film on a substrate surface of the dielectric substrate such as silicon. When a material of the circuit substrate 6 is silicon, the circuit substrate 6 is provided at a temperature lower than a predetermined temperature, and the silicon is a dielectric.

The wiring pattern includes the target qubit 1, the nonlinear microwave filter 2, and the control line 3.

The target qubit 1 is a qubit formed on the substrate surface of the circuit substrate 6. In the embodiment, the qubit is a superconducting qubit. The target qubit 1 is positioned at an end of the control line 3. The target qubit 1 is controlled by the control microwave CP via the control line 3 and is used for quantum information processing. The control line 3 is an example of the waveguide. A boundary condition of the electric field at the waveguide end of the control line 3 is an open end boundary condition.

The nonlinear microwave filter 2 is a qubit formed on the substrate surface of the circuit substrate 6. The nonlinear microwave filter 2 is coupled to the control line 3. That is, the nonlinear microwave filter 2 is a qubit which is formed on the circuit substrate 6, on which the target qubit 1 that is a qubit controlled in the superconducting quantum circuit QC is formed, and which is coupled to the waveguide to which the target qubit 1 is coupled.

The nonlinear microwave filter 2 is placed at a position where a distance from the target qubit 1 is a half-integer multiple of the microwave wavelength $\lambda_0$ corresponding to the resonant frequency $\omega_0$ of the target qubit 1. In the superconducting quantum circuit QC, as an example, the nonlinear microwave filter 2 is placed at a distance corresponding to one half of the microwave wavelength $\lambda_0$ corresponding to the resonant frequency $\omega_0$.

As described above, the nonlinear microwave filter 2 transmits a high-intensity electromagnetic field such as the control microwave CP, and reflects a low-intensity electromagnetic field such as a microwave photon emitted from the target qubit 1.

The nonlinear microwave filter 2 may be placed at a position where the distance from the target qubit 1 is within a predetermined range from the half-integer multiple of the microwave wavelength $\lambda_0$ corresponding to the resonant frequency $\omega_0$ of the target qubit 1. Here, in the present embodiment, the target qubit 1 is placed at the end of the waveguide. Therefore, a distance between the nonlinear microwave filter 2 and the waveguide end is within a predetermined range from the half-integer multiple of the microwave wavelength $\lambda_0$, which is the resonance wavelength.

Here, with reference to FIG. 7, a detailed example of the predetermined range will be described when the distance between the nonlinear microwave filter 2 and the waveguide end of the waveguide is within the predetermined range from the half-integer multiple of the microwave wavelength $\lambda_0$, which is the resonance wavelength.

Figure 7:
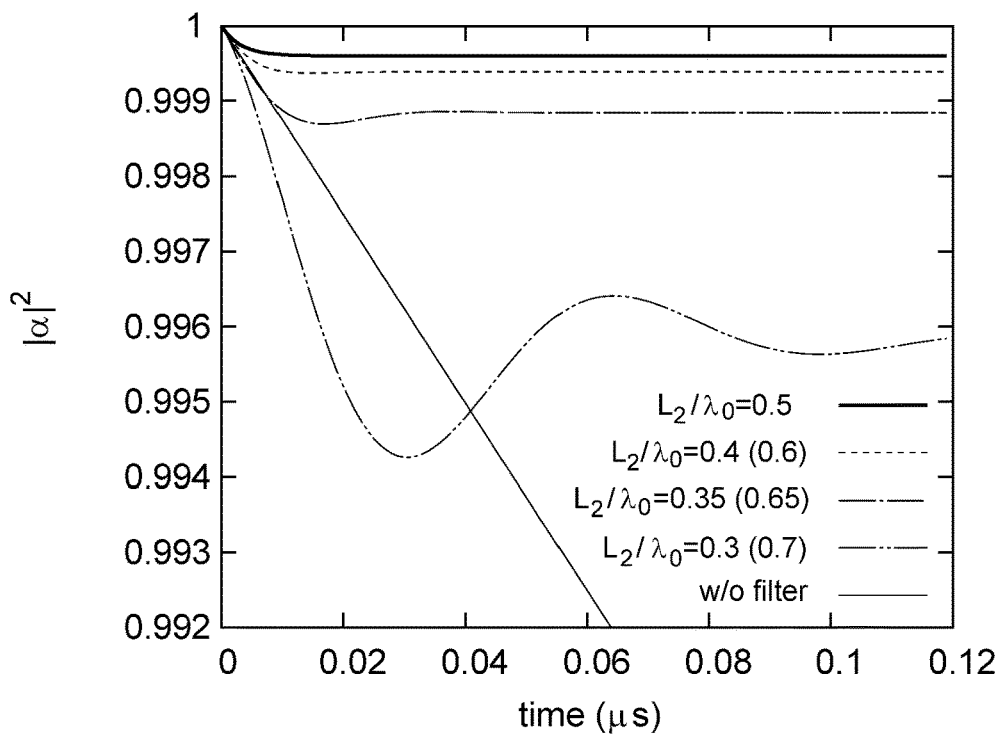
FIG. 7 is a diagram showing an example of a relationship between a position where the nonlinear microwave filter according to the embodiment of the present invention is provided and the decay of the target qubit.

FIG. 7 is a diagram showing an example of the relationship between the position of the nonlinear microwave filter 2 according to the present embodiment and the decay of the target qubit Q1. Graphs shown in FIG. 7 show time dependences of a probability $|\alpha|^2$ that the target qubit Q1 is in the excited state, for a case where the position of the nonlinear microwave filter 2 is 0.5 times of the microwave wavelength $\lambda_0$, which is half-integer multiple of the microwave wavelength $\lambda_0$, and of the microwave wavelength $\lambda_0$ for the cases where the position is 0.4 times, 0.35 times, 0.3 times, 0.6 times, 0.65 times, or 0.7 times of the microwave wavelengths $\lambda_0$, corresponding to the positions deviated from the half-integer multiple of the microwave wavelength $\lambda_0$. Here, shapes of graphs are the same in cases of a position corresponding to 0.4 times the microwave wavelength $\lambda_0$ and the position corresponding to 0.6 times, in cases of the position corresponding to 0.35 times and the position corresponding to 0.65 times, and in cases of the position corresponding to 0.3 times and the position corresponding to 0.7 times, respectively. FIG. 7 also shows a graph showing a result when the nonlinear microwave filter 2 is not provided for comparison.

As in the graph shown in FIG. 7, even when the position of the nonlinear microwave filter 2 deviates from the half-integer multiple of the microwave wavelength $\lambda_0$, the probability $|\alpha|2$ that the target qubit Q1 is in the excited state is maintained to be equal to or larger than 0.996 even though time elapses, if the position of the nonlinear microwave filter 2 is 0.4 times (or 0.6 times) or 0.35 times (or 0.65 times) of the microwave wavelength 4.

Therefore, in order to suppress the decay of the target qubit Q1 in the case where the distance between the nonlinear microwave filter 2 and the waveguide end is within the predetermined range from the half-integer multiple of the microwave wavelength $\lambda_0$, which is the resonance wavelength, the predetermined range can be exemplified as a range of 0.35 to 0.65 times the microwave wavelength $\lambda_0$.

Further, as described above, the difference between the resonant frequency of the target qubit Q1 and the resonant frequency of the nonlinear microwave filter Q2 may be within the predetermined range. Here, with reference to FIGS. 8 and 9, the predetermined range will be described in the case where the difference between the resonant frequency of the target qubit Q1 and the resonant frequency of the nonlinear microwave filter Q2 is within the predetermined range. In the description below, the difference between the resonant frequency of the target qubit Q1 and the resonant frequency of the nonlinear microwave filter Q2 is referred to as detuning.

Figure 8:
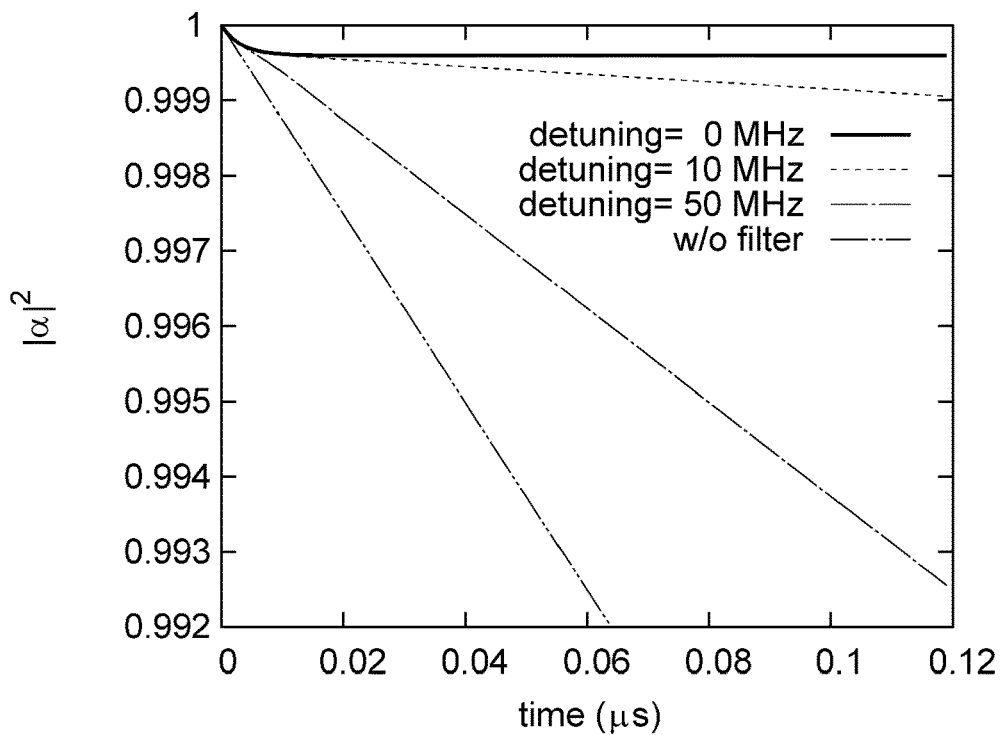
FIG. 8 is a diagram showing an example of a relationship between detuning and the decay of the target qubit according to the embodiment of the present invention.

FIG. 8 is a diagram showing an example of a relationship between the detuning and the decay of the target qubit Q1 according to the present embodiment. Graphs in FIG. 8 represent the time evolution of the probability $|\alpha|^2$ that the target qubit Q1 is in the excited state for the detunings of 0 MHz, 10 MHz, and 50 MHz. FIG. 8 also shows a graph showing a result when the nonlinear microwave filter 2 is not provided for comparison.

According to FIG. 8, in the cases where the detuning is other than 0 MHz, the graphs of the time evolution of the probability $|\alpha|^2$ that the target qubit Q1 is in the excited state have negative slopes. That is, when the resonant frequency of the nonlinear microwave filter Q2 deviates from the resonant frequency of the target qubit Q1, the target qubit Q1 has a finite decay rate.

Figure 9:
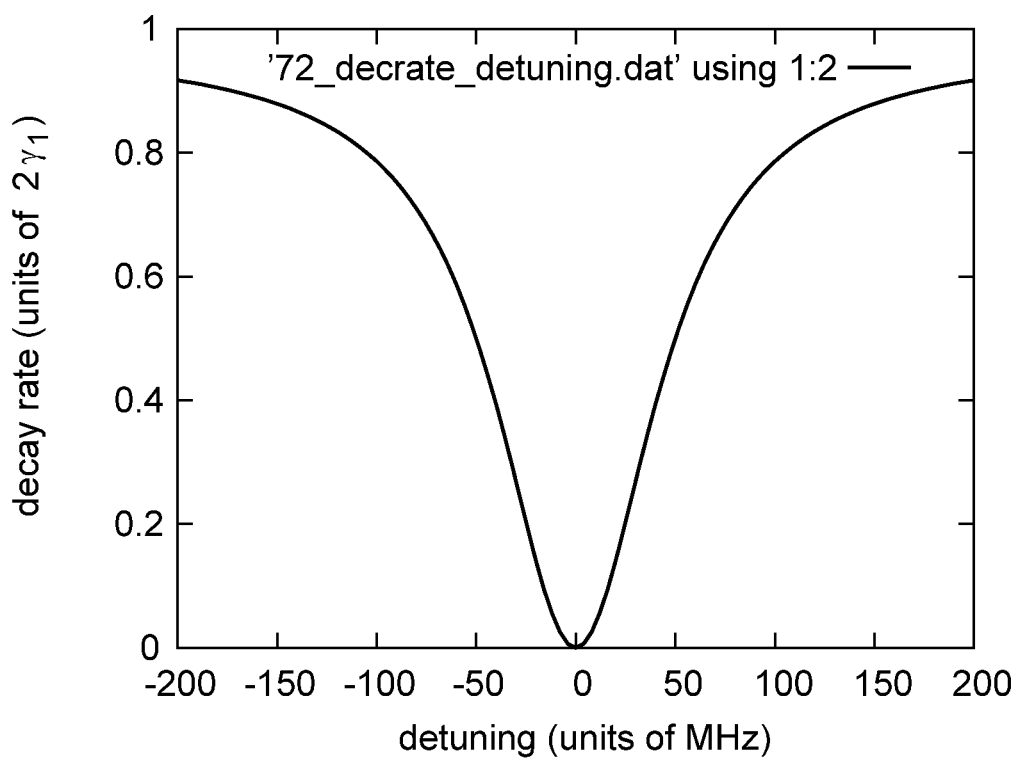
FIG. 9 is a diagram showing an example of a relationship between the detuning and a decay rate according to the embodiment of the present invention.

Here, FIG. 9 shows a relationship between the detuning and the decay rate. FIG. 9 is a diagram showing an example of the relationship between the detuning and the decay rate according to the present embodiment. The graph shown in FIG. 9 shows the decay rate with respect to the detuning. In the graph shown in FIG. 9, the decay rate is shown after being normalized by a value (twice the coupling $\gamma_1$, which is derived from Equation (20)) of the decay rate when the nonlinear microwave filter 2 is not provided.

From the graph shown in FIG. 9, for example, when the detuning is approximately the same (50 MHz) as the value of the coupling $\gamma_2$, it can be seen that the decay rate of the target qubit 1 is suppressed to approximately half the decay rate in the case where the nonlinear microwave filter 2 is not provided. From FIG. 9, as a range in which the decay rate is close to 0, for example, approximately 10% (5 MHz) of the value of the coupling $\gamma_2$ between the nonlinear microwave filter Q2 and the semi-infinite waveguide WG can be exemplified.

Modification Example of Installation Location of Nonlinear Microwave Filter

In the present embodiment, the case where the nonlinear microwave filter 2 is formed on the substrate surface of the circuit substrate 6 has been described. However, as a modification example, a case will be described where a nonlinear microwave filter 2*a* is formed on a back surface of a substrate surface, on which a target qubit 1*a* is formed, in the substrate surface of a circuit substrate 6*a*.

A superconducting quantum circuit QCa according to the modification example of the embodiment will be described with reference to FIGS. 10 to 13.

Figure 10:
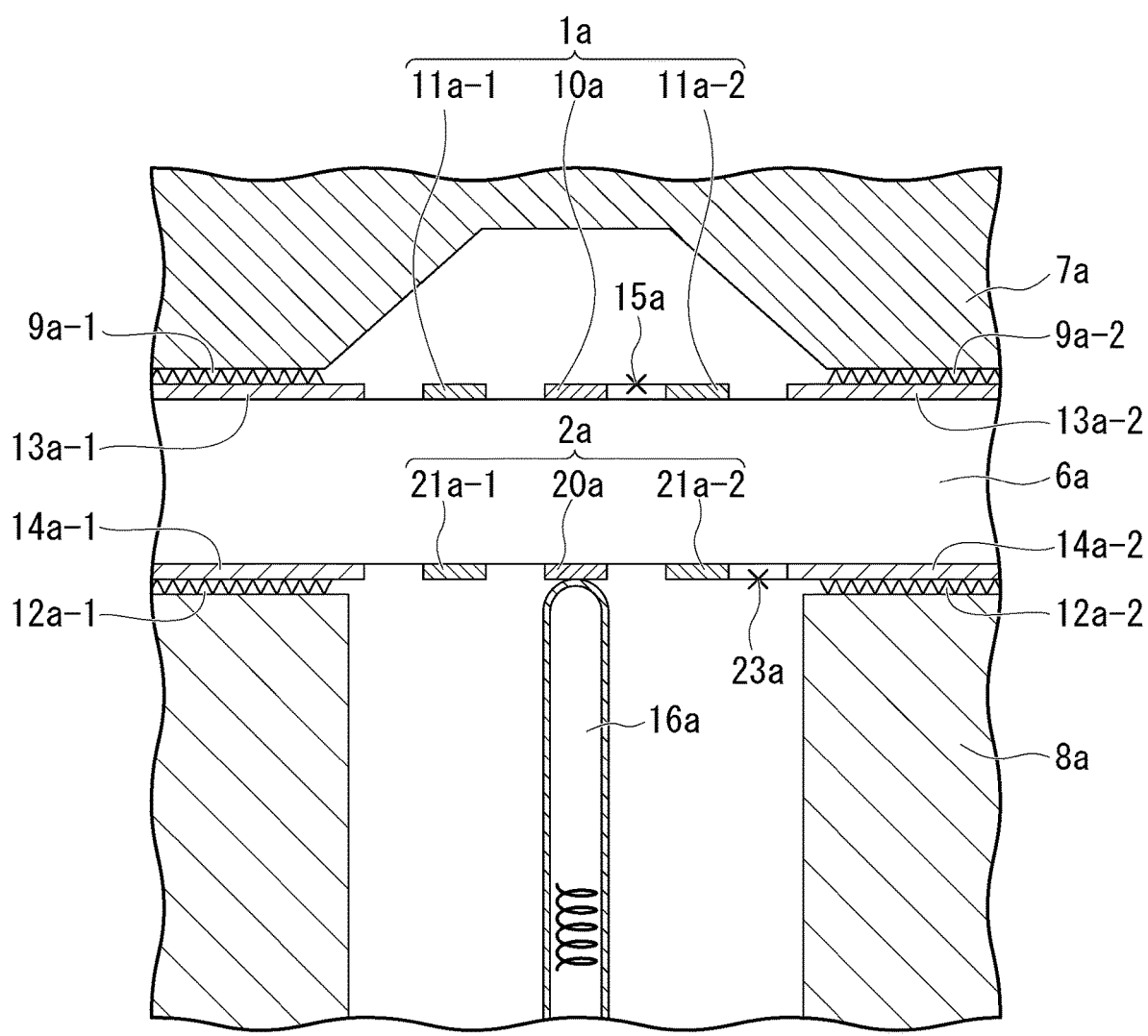
FIG. 10 is a diagram showing an example of a cross-sectional view of a superconducting quantum circuit according a modification example of the embodiment of the present invention.

FIG. 10 is a diagram showing an example of a cross-sectional view of the superconducting quantum circuit QCa according to the modification example of the present embodiment. The superconducting quantum circuit QCa includes the target qubit 1*a*, the nonlinear microwave filter 2*a*, the circuit substrate 6*a*, an upper ground electrode 7*a*, a lower ground electrode 8*a*, an upper bump 9*a*, a lower bump 12*a*, a substrate top surface ground electrode 13, a substrate bottom surface ground electrode 14, and a control signal line 16*a*. The circuit substrate 6*a* is sandwiched between the upper ground electrode 7*a* and the lower ground electrode 8*a*.

A side provided with the upper ground electrode 7*a* is referred to as an upper side when viewed from the circuit substrate 6*a*, and a side provided with the lower ground electrode 8*a* is referred to as a lower side when viewed from the circuit substrate 6*a*.

The target qubit 1*a* is formed on an upper surface S1, which is a substrate surface on the upper side of the circuit substrate 6*a*. The target qubit 1*a* is surrounded by a substrate top surface ground electrode 13*a* on the upper surface S1. The substrate top surface ground electrode 13*a* is a part of the ground pattern formed on the upper surface S1. A substrate top surface ground electrode 13*a*-1 and a substrate top surface ground electrode 13*a*-2 show a cross section of the substrate top surface ground electrode 13*a*.

The target qubit 1*a* includes a disk 10*a* and a ring 11*a* surrounding the disk 10*a*. Rings 11*a*-1 and 11*a*-2 show a cross section of the ring 11*a*. The disk 10*a* and the ring 11*a* are connected by a Josephson junction 15*a*.

Figure 11:
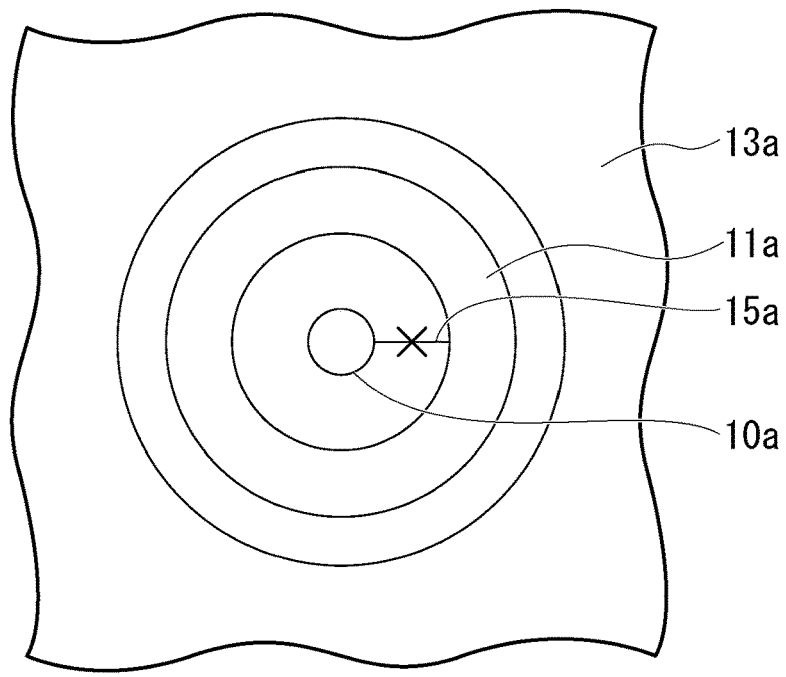
FIG. 11 is a diagram showing an example of the target qubit and a ground pattern on an upper surface of a circuit substrate according to the modification example of the embodiment of the present invention.

Here, FIG. 11 shows an upper surface S1*a* of the circuit substrate 6*a*. FIG. 11 is a diagram showing an example of the target qubit 1*a* and the ground pattern on the upper surface S1*a* of the circuit substrate 6*a* according to the modification example of the present embodiment.

The nonlinear microwave filter 2*a* of FIG. 10 is formed at a position of a lower surface S2*a* corresponding to a position of the target qubit 1*a* formed on the upper surface S1*a* of the circuit substrate 6*a*. The lower surface S2*a* is a substrate surface on the lower side of the circuit substrate 6*a*. That is, the nonlinear microwave filter 2 is a qubit formed on a back surface of the upper surface S1*a* on which the target qubit 1*a* is formed in the upper surface S1*a* of the circuit substrate 6*a*. The position corresponds to n=0 in FIG. 4.

Figure 12:
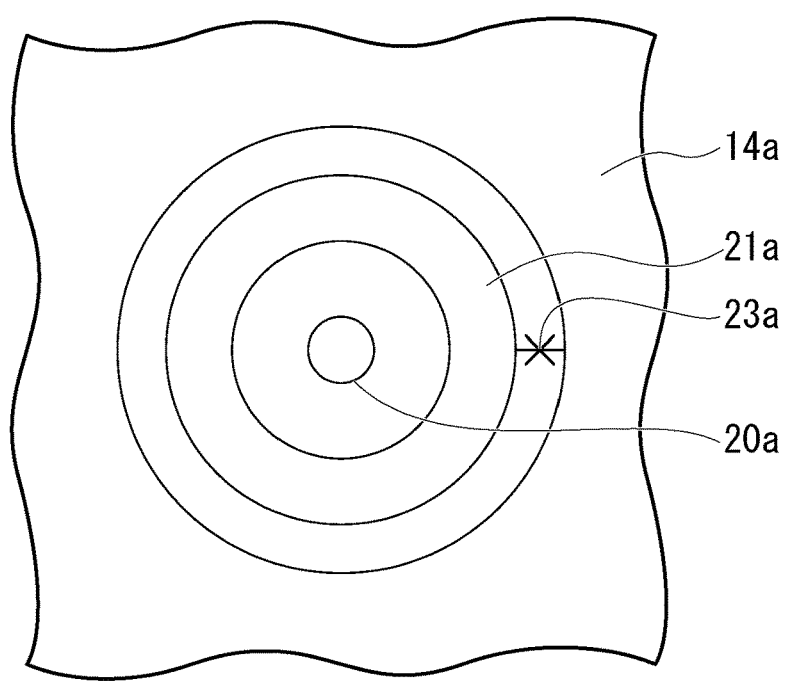
FIG. 12 is a diagram showing an example of the nonlinear microwave filter and the ground pattern on a lower surface of the circuit substrate according to the modification example of the embodiment of the present invention.

The nonlinear microwave filter 2*a* is surrounded by a substrate bottom surface ground electrode 14*a* of FIG. 12 on the lower surface S2*a*. The substrate bottom surface ground electrode 14*a* is a part of the ground pattern formed on the lower surface S2*a*. A substrate bottom surface ground electrode 14*a*-1 and a substrate bottom surface ground electrode 14*a*-2 in FIG. 10 show a cross section of the substrate bottom surface ground electrode 14*a*.

The nonlinear microwave filter 2*a* includes a central portion 20*a* and a ring 21*a* surrounding the central portion 20*a*. A ring 21*a*-1 and a ring 21*a*-2 show a cross section of the ring 21*a*. The ring 21*a* and a substrate bottom surface ground electrode 14*a* are connected by a Josephson junction 23*a*.

Here, FIG. 12 shows the lower surface S2*a* of the circuit substrate 6*a*. FIG. 12 is a diagram showing an example of the nonlinear microwave filter 2*a* and the ground pattern on the lower surface S2*a* of the circuit substrate 6*a* according to the modification example of the present embodiment.

The control signal line 16*a* penetrates the lower ground electrode 8*a* from the lower side and comes into contact with the central portion 20*a* of the nonlinear microwave filter 2*a*. The control signal line 16*a* supplies the target qubit 1*a* with the control microwave CP that controls the target qubit 1*a*. The control signal line 16*a* is, for example, a spring pin containing a spring inside. The control signal line 16*a* comes into contact with the central portion 20*a* due to an elastic force of the spring contained inside.

The upper bump 9*a* is provided between the upper ground electrode 7*a* and the substrate top surface ground electrode 13*a*. An upper bump 9*a*-1 and an upper bump 9*a*-2 are examples of the upper bump 9*a*. A lower bump 12*a* is provided between the lower ground electrode 8*a* and the substrate bottom surface ground electrode 14*a*. A lower bump 12*a*-1 and a lower bump 12*a*-2 are examples of the lower bump 12*a*.

The upper bump 9*a* and the lower bump 12*a* are formed, for example, by a superconductor having a ductility higher than that of the substrate top surface ground electrode 13*a* and the substrate bottom surface ground electrode 14*a*.

In the superconducting quantum circuit QCa, it is possible to remove an unnecessary gap between the upper ground electrode 7*a* and the ground pattern on the upper surface S1*a* of the circuit substrate 6*a* or an unnecessary gap between the lower ground electrode 8*a* and the ground pattern on the lower surface S2*a* of the circuit substrate 6*a*. Therefore, it is possible to suppress crosstalk between both the control signals propagating through the adjacent control signal line 16*a* or read signals. Here, the read signal propagates through a read signal line (not shown). In the superconducting quantum circuit QCa, the read signal line is provided to penetrate through the lower ground electrode 8*a* from the lower side, similarly to the control signal line 16*a*.

Here, an equivalent circuit corresponding to the superconducting quantum circuit QCa of FIG. 10 will be described with reference to FIG. 4 again.

The capacitor Cd3 corresponds to an electrical capacitance formed between the target qubit 1*a* and the control signal line 16*a*. The capacitor Cd4 corresponds to electrical capacitance formed between the nonlinear microwave filter 2*a* and the control signal line 16*a*.

Next, a modification example of the ground pattern of the lower surface S2*a* in the superconducting quantum circuit QCa will be described with reference to FIGS. 13 and 14.

Figure 13:
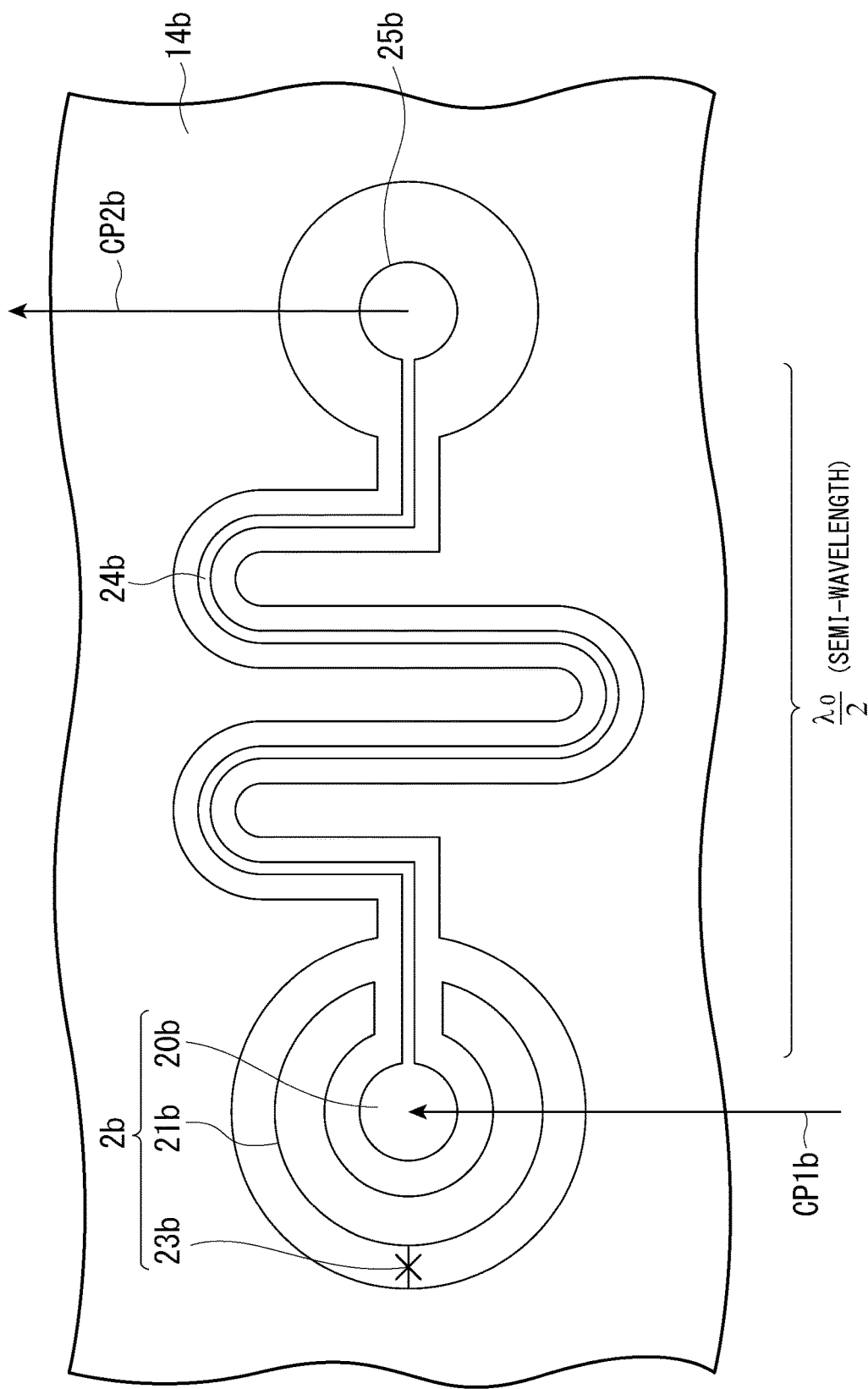
FIG. 13 is a diagram showing a first modification example of installation locations of the nonlinear microwave filter and the ground pattern on the lower surface of the circuit substrate according to the modification example of the embodiment of the present invention.

FIG. 13 is a diagram showing a first modification example of installation locations of the nonlinear microwave filter 2*b* and the ground pattern on the lower surface S2*b* of the circuit substrate 6*b* according to the modification example of the embodiment. The nonlinear microwave filter 2*b* is formed on the lower surface S2*b* of the circuit substrate 6*b*.

The nonlinear microwave filter 2b includes a disk 20b and a ring 21b surrounding the disk 20b. The ring 21b and a substrate bottom surface ground electrode 14b are connected by a Josephson junction 23b.

The disk 20b is a part of the nonlinear microwave filter 2b and, at the same time, is a part of a control line 24b. The disk 20b is an end portion of the control line 24b. A disk 25b is an end portion, which is opposite to the disk 20b, of end portions of the control line 24b.

The disk 25b is formed at a position of the lower surface S2b corresponding to a position of the target qubit 1b formed on the upper surface S1b of the circuit substrate 6b. Here, a distance between the disk 20b and the disk 25b is equal to the half-integer multiple of the resonance wavelength.

A control microwave CP1b is incident from the disk 20b, propagates through the control line 24b, and then exits from the disk 25b to the target qubit 1b formed on the upper surface S1b of the circuit substrate 6b.

Figure 14:
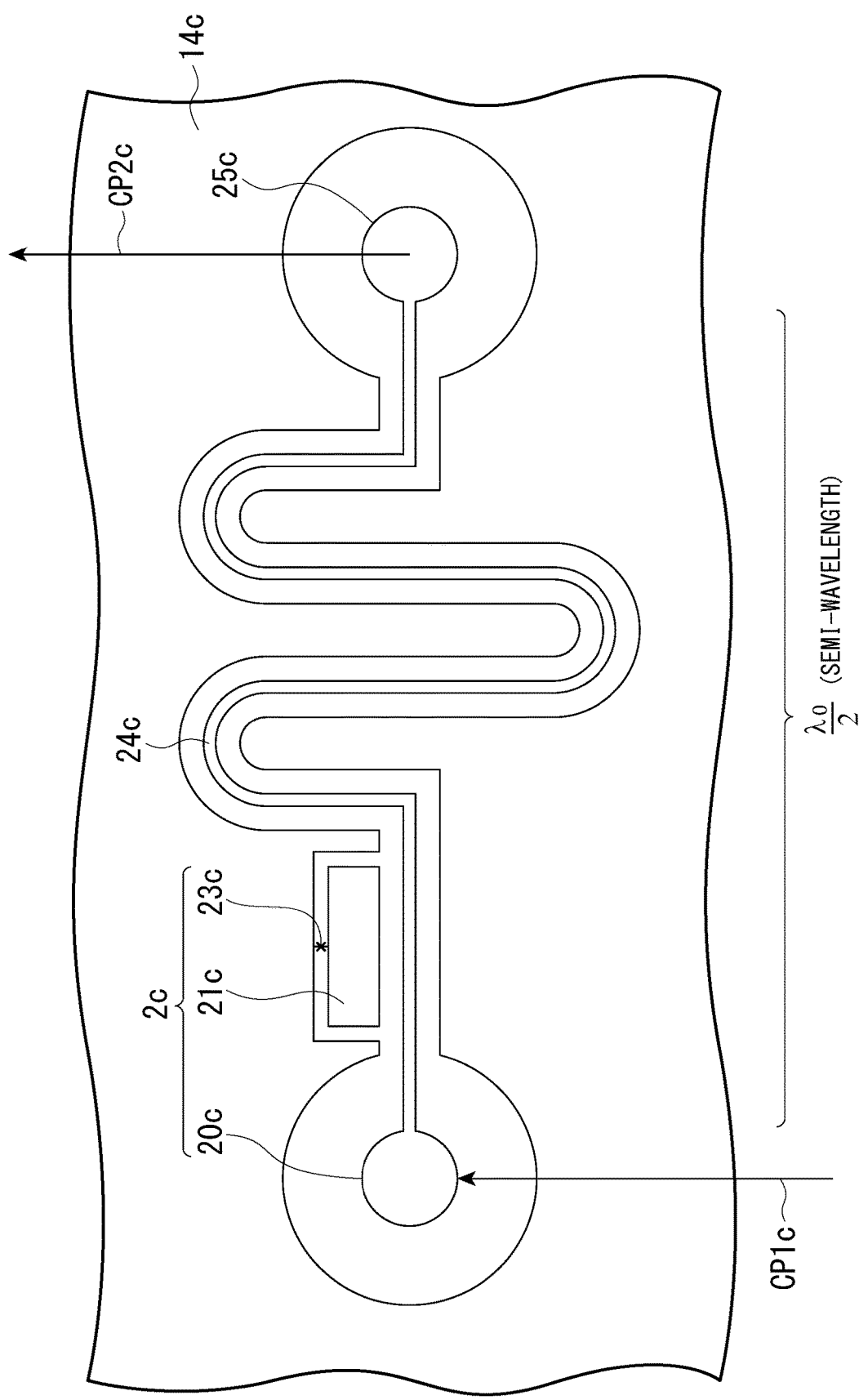
FIG. 14 is a diagram showing a second modification example of the installation location of the nonlinear microwave filter and the ground pattern on the lower surface of the circuit substrate according to the modification example of the embodiment of the present invention.

FIG. 14 is a diagram showing a second modification example of the installation location of a nonlinear microwave filter 2c and the ground pattern on the lower surface S2c of the circuit substrate 6c according to the modification example of the embodiment. The nonlinear microwave filter 2c is formed on the lower surface S2c of the circuit substrate 6c. The nonlinear microwave filter 2c includes a disk 20b and a rectangle 21c formed along the control line 24c. The rectangle 21c and a substrate bottom surface ground electrode 14c are connected by a Josephson junction 23c.

A disk 20c is part of the nonlinear microwave filter 2c and, at the same time, is a part of the control line 24c. The disk 20c is an end portion of the control line 24c. A disk 25c is an end portion, which is opposite to the disk 20c, of end portions of the control line 24c.

The disk 25c is formed at a position of the lower surface S2c corresponding to a position of the target qubit 1c formed on the upper surface S1c of the circuit substrate 6c. Here, the distance between the disk 20c and the disk 25c is equal to the half-integer multiple of the resonance wavelength.

The control microwave CP1c is incident from the disk 20c, propagates through the control line 24c, and then exits from the disk 25c to the target qubit 1c formed on the upper surface S1c of the circuit substrate 6c.

Summary

As described above, a nonlinear microwave filter 2 according to the present embodiment includes: a qubit that is formed on a circuit substrate 6 on which a target qubit 1, which is a qubit controlled in a superconducting quantum circuit QC, is formed, and that is coupled to a control waveguide (in the example, control line 3) to which the target qubit 1 is coupled, in which a distance to a waveguide end of the control waveguide (in the example, control line 3) is within a predetermined range from the half-integer multiple of a resonance wavelength, the qubit has a resonant frequency in which a difference from a resonant frequency of the target qubit 1 is within a predetermined range, and a coupling between the qubit and the control waveguide (in the example, control line 3) is stronger by a predetermined value than a coupling between the target qubit 1 and the control waveguide (in the example, the control line 3).

With this configuration, the nonlinear microwave filter 2 according to the present embodiment transmits a high-intensity microwave such as the control microwave CP, and reflects a low-intensity microwave, such as spontaneous emission light, from the target qubit 1, so that it is possible to suppress a long operation time of the qubit and to suppress a short lifetime of the qubit at the same time. That is, in the nonlinear microwave filter 2 according to the present embodiment, it is possible to eliminate the trade-off relationship between the extension of the qubit lifetime T1 and the reduction of the gate time Tg, and it is possible to perform control of the target qubit 1 in a short time and to extend the lifetime at the same time.

Further, in the nonlinear microwave filter 2 according to the present embodiment, the target qubit 1 is positioned at the end of the control waveguide (in the example, the control line 3).

With this configuration, the nonlinear microwave filter 2 according to the present embodiment does not require high accuracy related to control of the position of the nonlinear microwave filter 2 as compared with the case where the target qubit 1 and the nonlinear microwave filter 2 are coupled to the infinite waveguide, so that it is possible to increase the degree of freedom in circuit design.

Further, the nonlinear microwave filters 2a, 2b, and 2c according to the modification example of the present embodiment are qubits formed on the back surface (in the example, the lower surfaces S2a, S2b, S2c) of the substrate surfaces (in the example, the upper surfaces S1a, S1b, S1c) on which the target qubits 1a, 1b, and 1c are formed in the substrate surfaces of the circuit substrates 6a, 6b, and 6c.

With the configuration, in the nonlinear microwave filters 2a, 2b, and 2c according to the modification example of the present embodiment, it is possible to secure a uniform density of the wiring pattern regardless of the number of target qubits 1a, 1b, and 1c on the substrate surfaces of the circuit substrates 6a, 6b, and 6c, so that it is possible to suppress the density of the wiring pattern from being increased on the substrate surfaces of the circuit substrates 6a, 6b, and 6c while performing control of the target qubit 1 in a short time and to extend the lifetime at the same time.

Although some embodiments are described in detail with reference to the drawings, a specific configuration is not limited to the above description, and various design changes and the like are possible within the scope of the invention without departing from the gist of the invention.

REFERENCE SIGNS LIST

QC: Superconducting quantum circuit
1: Target qubit
2: Nonlinear microwave filter
3: Control line
6: Circuit substrate

What is claimed is:
1. A nonlinear microwave filter, comprising:
 a qubit that is formed on a circuit substrate on which a target qubit, which is a qubit to be controlled by a microwave in a superconducting quantum circuit is formed, and that is coupled to a control waveguide to which the target qubit is coupled, wherein
 a distance from the qubit to a waveguide end of the control waveguide is within a range of 0.35+n/2 to 0.65+n/2 times a resonance wavelength of the target qubit wherein n is an integer,
 the qubit has a resonant frequency the deviation of which from the resonant frequency of the target qubit is within a predetermined range, and
 a coupling between the qubit and the control waveguide is stronger by a predetermined value than a coupling between the target qubit and the control waveguide.
2. The nonlinear microwave filter according to claim 1, wherein
 the target qubit is positioned at the waveguide end.

3. The nonlinear microwave filter according to claim 1, wherein
   the nonlinear microwave filter is the qubit formed on a back surface of a substrate surface on which the target qubit is formed in substrate surfaces of the circuit substrate.

4. A nonlinear microwave filter, comprising:
   a qubit that is formed on a circuit substrate on which a target qubit, which is a qubit to be controlled by a microwave in a superconducting quantum circuit and has a resonant frequency equal to frequency of the microwave, is formed, and that is coupled to a control waveguide to which the target qubit is coupled, wherein
   a distance from the qubit to a waveguide end of the control waveguide is within a range of 0.35+n/2 to 0.65+n/2 times a resonance wavelength of the target qubit wherein n is an integer,
   a resonant frequency of the qubit is equal to the resonant frequency of the target qubit, and
   a coupling between the qubit and the control waveguide is stronger by a predetermined value than a coupling between the target qubit and the control waveguide.

5. The nonlinear microwave filter according to claim 4, wherein
   a coupling between the qubit and the control waveguide is 100 to 1000 times stronger than the coupling between the target qubit and the control waveguide.

* * * * *